United States Patent
Fukunaga (10) Patent No.: US 6,668,002 B2
(45) Date of Patent: Dec. 23, 2003

(54) SEMICONDUCTOR LASER DEVICE INCLUDING ARROW STRUCTURE FORMED WITHOUT P-AS INTERDIFFUSION AND AL OXIDATION

(75) Inventor: Toshiaki Fukunaga, Kaisei-machi (JP)

(73) Assignee: Fuji Photo Film Co., Ltd., Kanagawa-Ken (JP)

( * ) Notice: Subject to any disclaimer, the term of this patent is extended or adjusted under 35 U.S.C. 154(b) by 63 days.

(21) Appl. No.: 10/106,040

(22) Filed: Mar. 27, 2002

(65) Prior Publication Data

US 2002/0172246 A1 Nov. 21, 2002

(30) Foreign Application Priority Data

Mar. 27, 2001 (JP) ..................... 2001/089825
Sep. 8, 2001 (JP) ..................... 2001/302224

(51) Int. Cl.[7] ................................ H01S 5/00
(52) U.S. Cl. .......................... 372/46; 372/43
(58) Field of Search ................... 372/46, 45, 49

(56) References Cited

U.S. PATENT DOCUMENTS

| | | | |
|---|---|---|---|
| 5,528,614 A | * | 6/1996 | Watanabe ............... 372/45 |
| 5,606,570 A | | 2/1997 | Botez et al. |
| 5,889,805 A | * | 3/1999 | Botez et al. ............ 372/45 |
| 6,396,863 B1 | * | 5/2002 | Fukunaga ............... 372/46 |
| 6,560,261 B2 | * | 5/2003 | Fukunaga et al. ........ 372/46 |
| 6,567,444 B2 | * | 5/2003 | Hayakawa ............... 372/45 |
| 6,580,738 B2 | * | 6/2003 | Fukunaga ............... 372/46 |

* cited by examiner

Primary Examiner—Paul Ip
Assistant Examiner—Dung Nguyen
(74) Attorney, Agent, or Firm—Sughrue Mion, PLLC (57) ABSTRACT

In a semiconductor laser device: an n-type $In_{0.49}Ga_{0.51}P$ cladding layer, an undoped or n-type $In_{x1}Ga_{1-x1}As_{1-y1}P_{y1}$ optical waveguide layer, an $In_{x3}Ga_{1-x3}As_{1-y3}P_{y3}$ compressive-strain quantum-well active layer, an undoped or p-type $In_{x1}Ga_{1-x1}As_{1-y1}P_{y1}$ optical waveguide layer, a p-type $In_{0.49}Ga_{0.51}P$ cladding layer, and a p-type GaAs etching stop layer are formed on an n-type GaAs substrate; a p-type $In_{x8}Ga_{1-x8}P$ etching stop layer and an n-type GaAs current confinement layer are formed corresponding to high-refractive-index regions which realize an ARROW structure; a p-type $In_{x9}Ga_{1-x9}P$ etching stop layer is formed over the n-type GaAs current confinement layer and exposed areas of the first etching stop layer; a p-type GaAs etching stop layer and an n-type $In_{0.49}Ga_{0.51}P$ current confinement layer are formed in regions other than a current injection region; and a p-type $In_{0.49}Ga_{0.51}P$ cladding layer and a p-type GaAs contact layer are formed over the entire upper surface.

5 Claims, 8 Drawing Sheets

SEMICONDUCTOR LASER DEVICE INCLUDING ARROW STRUCTURE FORMED WITHOUT P-AS INTERDIFFUSION AND AL OXIDATION

BACKGROUND OF THE INVENTION

1. Field of the Invention

The present invention relates to a semiconductor laser device including an ARROW (Antiresonant Reflecting Optical Waveguide) structure. The present invention also relates to a process for producing a semiconductor laser device including an ARROW structure.

2. Description of the Related Art

A reliable high-power semiconductor laser device which emits a high-quality, diffraction-limited beam is required for use as a light source for exciting an optical fiber amplifier.

U.S. Pat. No. 5,606,570 discloses a semiconductor laser device having an ARROW (Antiresonant Reflecting Optical Waveguide) structure as a semiconductor laser device which can emit a high-power, diffraction-limited laser beam in the 980 nm band. The ARROW structure is a structure for confining light in a core region. The disclosed ARROW structure includes a plurality of core regions having a low equivalent (effective) refractive index, high-refractive-index regions which have a high equivalent refractive index and are arranged between the plurality of core regions and on the outer sides of the plurality of core regions, and low-refractive-index regions which have a low equivalent refractive index and are arranged on the outer sides of the outermost ones of the high-refractive-index regions. The high-refractive-index regions function as a reflector of light in the fundamental mode, and the low-refractive-index regions suppress leakage of light. Thus, the semiconductor laser device can be controlled so as to operate in the fundamental transverse mode.

In addition, it is reported that a preferable value of the width $d_{b1}'$ of each of the outermost ones of the high-refractive-index regions is determined in accordance with the equation (1), a preferable value of the width $d_{b2}'$ of each of the high-refractive-index regions arranged between the plurality of core regions is determined in accordance with the equation (2), and a preferable value of the width of each of the low-refractive-index regions is $d_c'/2$, where $d_c'$ is the width of each of the plurality of core regions. In the equations (1) and (2), $\lambda$ is the oscillation wavelength, $n_c'$ is the equivalent refractive index of the plurality of core regions, and $n_b'$ is the equivalent refractive index of the high-refractive-index regions.

$$d_{b1}' = \frac{3\lambda}{4\left\{n_b'^2 - n_c'^2 + \left(\frac{\lambda}{2d_c'}\right)^2\right\}^{\frac{1}{2}}} \quad (1)$$

$$d_{b2}' = \frac{\lambda}{2\left\{n_b'^2 - n_c'^2 + \left(\frac{\lambda}{2d_c'}\right)^2\right\}^{\frac{1}{2}}} \quad (2)$$

However, the semiconductor laser device disclosed in U.S. Pat. No. 5,606,570 includes an active layer made of InGaAs, and the ARROW structure is formed with a current confinement layer made of InGaAlP and a high-refractive-index region made of GaAs by using a regrowth technique. In addition, GaAs and InGaP layers (or InAlP, GaAs, and InGaP layers) are exposed at the base surface on which a cladding layer is regrown. Therefore, P—As interdiffusion occurs at the exposed surface during a process of raising temperature for the regrowth, and thus the regrowth is likely to become defective. As a result, the above semiconductor laser device is not actually used. Further, there is a high degree of technical difficultly in regrowing layers when a layer (such as the InAlP layer) exposed at the base surface on which the cladding layer is regrown contains aluminum, which is prone to oxidation.

SUMMARY OF THE INVENTION

An object of the present invention is to provide a semiconductor laser device which includes an ARROW structure and is not technically difficult to produce.

Another object of the present invention is to provide a process for producing with high precision a reliable semiconductor laser device which includes an ARROW structure.

(I) According to the first aspect of the present invention, there is provided a semiconductor laser device comprising: a GaAs substrate of a first conductive type; a first lower cladding layer formed above the GaAs substrate and made of $In_{0.49}Ga_{0.51}P$ of the first conductive type; a lower optical waveguide layer formed above the first lower cladding layer and made of $In_{x1}Ga_{1-x1}As_{1-y1}P_{y1}$ which is undoped or the first conductive type, where x1=0.49y1 and $0 \leq y1 \leq 0.3$; a compressive-strain quantum-well active layer formed above the lower optical waveguide layer and made of $In_{x3}Ga_{1-x3}As_{1-y3}P_{y3}$ where $0.49y3<x3 \leq 0.4$ and $0 \leq y3 \leq 0.1$; an upper optical waveguide layer formed above the compressive-strain quantum-well active layer and made of $In_{x1}Ga_{1-x1}As_{1-y3}P_{y1}$ which is undoped or a second conductive type, where x1=0.49y1 and $0 \leq y1 \leq 0.3$; a first upper cladding layer of the second conductive type, formed above the upper optical waveguide layer and made of one of $In_{0.49}Ga_{0.51}P$ and $Al_xGa_{1-x}As$ which has an approximately identical refractive index to a refractive index of $In_{0.49}Ga_{0.51}P$, where $0.45 \leq x \leq 0.55$; a first etching stop layer formed above the first upper cladding layer and made of GaAs of the second conductive type; a second etching stop layer made of $In_{x8}Ga_{1-x8}P$ of the second conductive type and formed above the first etching stop layer other than stripe areas of the first etching stop layer corresponding to at least one current injection region and low-refractive-index regions located on outer sides of the at least one current injection region and separated from the at least one current injection region or outermost ones of the at least one current injection region by a predetermined interval, where $0 \leq x8 \leq 1$, and the stripe areas of the first etching stop layer extend in a direction of a laser resonator; a first current confinement layer made of GaAs of the first conductive type and formed above the second etching stop layer; a third etching stop layer made of $In_{x9}Ga_{1-x9}P$ of the second conductive type and formed over the first current confinement layer and the stripe areas of the first etching stop layer, where $0 \leq x9 \leq 1$; a fourth etching stop layer made of GaAs of the second conductive type and formed above the third etching stop layer other than at least one stripe area of the third etching stop layer corresponding to the at least one current injection region; a second current confinement layer made of $In_{0.49}Ga_{0.51}P$ of the first conductive type and formed above the fourth etching stop layer; a second upper cladding layer of the second conductive type, formed above the second current confinement layer and the at least one stripe area of the third etching stop layer, and made of one of $In_{0.49}Ga_{0.51}P$ and $Al_xGa_{1-x}As$ which has an approximately identical refractive index to the refractive index of $In_{0.49}Ga_{0.51}P$, where $0.45 \leq x \leq 0.55$; and a contact layer made of GaAs of the second conductive type and formed above the second upper cladding layer.

(i) The current injection region may have a width equal to or greater than 3 micrometers.

(ii) The first current confinement layer may include first and second sublayers made of GaAs of the first conductive type, and a quantum-well layer formed between the first and second sublayers and made of an InGaAs material which has a smaller bandgap than the bandgap of the compressive-strain quantum-well active layer.

(iii) The semiconductor laser device according to the first aspect of the present invention may further comprise a second lower cladding layer made of $Al_xGa_{1-x}As$ of the first conductive type and formed between the GaAs substrate and the first lower cladding layer, where $0.45 \leq x \leq 0.55$. In this case, it is preferable that the thickness of the InGaP lower cladding layer does not exceed 0.5 micrometers.

(II) According to the second aspect of the present invention, there is provided a process for producing a semiconductor laser device, comprising the steps of: (a) forming above a GaAs substrate of a first conductive type a lower cladding layer made of $In_{0.49}Ga_{0.51}P$ of the first conductive type; (b) forming above the lower cladding layer a lower optical waveguide layer made of $In_{0.49}Ga_{0.51}As_{1-y1}P_{y1}$ which is undoped or the first conductive type, where $x1=0.49y1$ and $0 \leq y1 \leq 0.3$; (c) forming above the lower optical waveguide layer a compressive-strain quantum-well active layer made of $In_{x3}Ga_{1-x3}As_{1-y3}P_{y3}$, where $0.49y3<x3 \leq 0.4$ and $0 \leq y3 \leq 0.1$; (d) forming above the compressive-strain quantum-well active layer an upper optical waveguide layer made of $In_{x1}Ga_{1-x1}As_{1-y1}P_{y1}$ which is undoped or a second conductive type, where $x1=0.49y1$ and $0 \leq y1 \leq 0.3$; (e) forming above the upper optical waveguide layer a first upper cladding layer of the second conductive type which is made of one of $In_{0.49}Ga_{0.51}P$ and $Al_xGa_{1-x}As$ having an approximately identical refractive index to a refractive index of $In_{0.49}Ga_{0.51}P$, where $0.45 \leq x \leq 0.55$; (f) forming above the first upper cladding layer a first etching stop layer made of GaAs of the second conductive type; (g) forming above the first etching stop layer a second etching stop layer made of $In_{x8}Ga_{1-x8}P$ of the second conductive type, where $0 \leq x8 \leq 1$; (h) forming above the second etching stop layer a first current confinement layer made of GaAs of the first conductive type; (i) removing stripe regions of the first current confinement layer and the first etching stop layer which extend in a resonator direction so as to produce an intermediate layered structure in which stripe areas of the first etching stop layer are exposed, where the stripe areas of the first etching stop layer extend in a direction of a laser resonator, and correspond to at least one current injection region and low-refractive-index regions located on outer sides of the at least one current injection region and separated from the at least one current injection region or outermost ones of the at least one current injection region by a predetermined interval; (j) raising the temperature of the intermediate layered structure in an arsenic atmosphere; (k) forming above the first current confinement layer and the stripe areas of the first etching stop layer a third etching stop layer made of $In_{x9}Ga_{1-x9}P$ of the second conductive type, where $0 \leq x9 \leq 1$; (l) forming above the third etching stop layer a fourth etching stop layer made of GaAs of the second conductive type; (m) forming above the fourth etching stop layer a second current confinement layer made of $In_{0.49}Ga_{0.51}P$ of the first conductive type; (n) removing stripe regions of the second current confinement layer and the fourth etching stop layer so that at least one stripe area of the third etching stop layer is exposed, where the at least one stripe area of the third etching stop layer corresponds to the at least one current injection region; (o) forming above the second current confinement layer and the at least one stripe area of the third etching stop layer a second upper cladding layer of the second conductive type which is made of one of $In_{0.49}Ga_{0.51}P$ and $Al_xGa_{1-x}As$ having an approximately identical refractive index to the refractive index of $In_{0.49}Ga_{0.51}P$, where $0.45 \leq x \leq 0.55$; and (p) forming above the second upper cladding layer a contact layer made of GaAs of the second conductive type.

(III) The semiconductor laser device according to the first aspect of the present invention and the process according to the second aspect of the present invention have the following advantages.

(i) In the semiconductor laser device according to the first aspect of the present invention, the first current confinement layer made of GaAs of the first conductive type has a higher refractive index than the refractive indexes of the second current confinement layer made of $In_{0.49}Ga_{0.51}P$ of the first conductive type and the second upper cladding layer of the second conductive type. Therefore, in the active layer, first high-refractive-index regions which have a high equivalent refractive index are realized between the at least one core region (corresponding to the at least one current injection region each of which has a stripe shape) and on the outer sides of the at least one core region in the direction perpendicular to thickness and propagation of light, low-refractive-index regions which have a low equivalent refractive index are realized on the outer sides of the outermost ones of the first high-refractive-index regions in the direction, and second high-refractive-index regions which have a high equivalent refractive index are realized on the outer sides of the low-refractive-index regions in the direction. That is, the distribution of the equivalent refractive index of the active layer in the direction perpendicular to thickness and propagation of light realizes the aforementioned ARROW structure.

Since the semiconductor laser device according to the first aspect of the present invention includes the ARROW structure, the semiconductor laser device according to the first aspect of the present invention can emit a single peak beam in a transverse mode which is more effectively controlled than that in semiconductor laser devices which do not include the ARROW structure, even when the stripe width is increased.

In order to effectively control the transverse mode oscillation in the semiconductor laser devices which do not include the ARROW structure, the stripe width is required to be reduced to 3 micrometers or smaller, i.e., the width of the active region is required to be reduced. Therefore, when the output power is increased, the optical density in the active layer increases, and thus facet degradation is likely to occur. Consequently, the semiconductor laser devices which do not include the ARROW structure cannot operate with high output power in an effectively controlled transverse mode.

On the other hand, since the semiconductor laser device according to the first aspect of the present invention includes the ARROW structure, light can be effectively confined in a wide stripe (active) region in the semiconductor laser device according to the first aspect of the present invention, and therefore the semiconductor laser device according to the first aspect of the present invention can emit laser light in the fundamental transverse mode from the wide active region. In particular, when the width of the active region is increased to 3 micrometers or greater, the optical density in the active layer can be reduced, and therefore the temperature rise due to the non-radiative recombination in the vicinity of the end facet can be suppressed. Thus, the semiconductor laser device according to the first aspect of the present invention can emit a laser beam in the fundamental transverse mode with higher power than the semiconductor laser devices which do not include the ARROW structure.

(ii) When the process according to the second aspect of the present invention is used, a semiconductor laser device including an ARROW structure, which is realized with the aforementioned first and second high-refractive-index regions and low-refractive-index regions in the active layer, can be easily produced with high precision.

(iii) According to the construction of the semiconductor laser device according to the first aspect of the present invention, which can be produced by the process according to the second aspect of the present invention, the layers exposed at the base surface on which the third etching stop layer is regrown are only GaAs layers, and the layers exposed at the base surface on which the second upper cladding layer is regrown are only InGaP layers, i.e., the base surfaces of regrowth do not contain aluminum. Therefore, the regrowth of the second upper cladding layer does not have technical difficulty.

(iv) In addition, since As and P do not concurrently exist at each base surface of regrowth, the As—P interdiffusion can be suppressed, for example, when the temperature is raised in a phosphorus atmosphere before the the second conductive type InGaP second upper cladding layer and the second conductive type GaAs contact layer are formed. Therefore, it is possible to improve the quality of the regrown crystal.

(v) Further, since the double-layer etching stop layers constituted by the InGaP layer and the GaAs layer are used, the precision in etching can be improved, i.e., the distribution of the equivalent refractive index which realizes the ARROW structure can be formed with high precision.

(vi) In the case where the first current confinement layer is constituted by first and second sublayers made of GaAs of the first conductive type and a quantum-well layer formed between the first and second sublayers and made of an InGaAs material which has a smaller bandgap than the bandgap of the compressive-strain quantum-well active layer, the gain of oscillation in the fundamental transverse mode can be increased since the InGaAs quantum-well layer absorbs light.

(vii) In the case where a second lower cladding layer made of $Al_xGa_{1-x}As$ ($0.45 \leq x \leq 0.55$) of the first conductive type is formed between the GaAs substrate and the first lower cladding layer, leakage of carriers from the active region can be effectively suppressed since AlGaAs has a greater bandgap than InGaP.

Although the first lower cladding layer per se may be formed with only $Al_xGa_{1-x}As$, the provision of both of the InGaP first lower cladding layer and the AlGaAs second lower cladding layer is more advantageous because it is possible to reduce the time needed for changing gas before the InGaAsP lower optical waveguide layer is formed, and improve the quality of the interface between the InGaAsP lower optical waveguide layer and the InGaP first lower cladding layer.

Further, when the thickness of the InGaP first lower cladding layer is reduced to 0.5 micrometers or smaller, the semiconductor layers can be formed without deterioration of surface morphology.

DESCRIPTION OF PREFERRED EMBODIMENTS

Embodiments of the present invention are explained in detail below with reference to drawings.

First Embodiment

Figure 1:
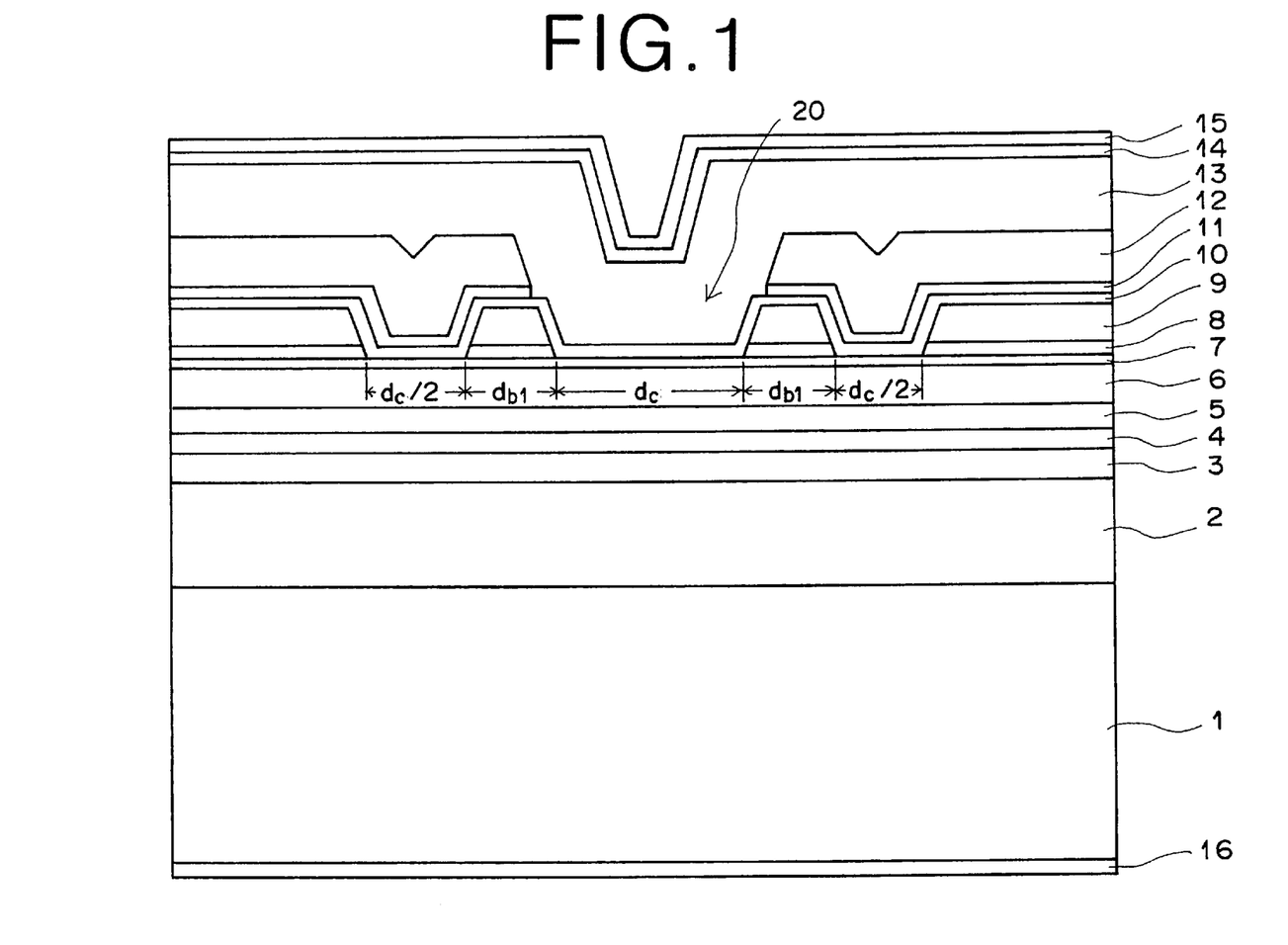
FIG. 1 is a diagram illustrating a cross section of a semiconductor laser device as a first embodiment of the present invention.

FIG. 1 shows a cross section of a semiconductor laser device as the first embodiment of the present invention.

As illustrated in FIG. 1, an n-type $In_{0.49}Ga_{0.51}P$ lower cladding layer 2, an n-type or i-type (intrinsic) $In_{x1}Ga_{1-x1}As_{1-y1}P_{y1}$ lower optical waveguide layer 3 (x1= 0.49y1, $0 \leq y1 \leq 0.3$), an $In_{x3}Ga_{1-x3}As_{1-y3}P_3$ compressive-strain quantum-well active layer 4 ($0.49y3<x3 \leq 0.4$, $0 \leq y3 \leq 0.1$), a p-type or i-type $In_{x1}Ga_{1-x1}As_{1-y1}P_{y1}$ upper optical waveguide layer 5, a p-type $In_{0.49}Ga_{0.51}P$ first upper cladding layer 6, and a p-type GaAs first etching stop layer 7 are formed on an n-type GaAs substrate 1.

The semiconductor laser device of FIG. 1 further comprises a p-type $In_{x8}Ga_{1-x8}P$ second etching stop layer 8

($0 \leq x8 \leq 1$), an n-type GaAs first current confinement layer 9, a p-type $In_{x9}Ga_{1-x9}P$ third etching stop layer 10 ($0 \leq x9 \leq 1$), a p-type GaAs fourth etching stop layer 11, an n-type $In_{0.49}Ga_{0.51}P$ second current confinement layer 12, a p-type $In_{0.49}Ga_{0.51}P$ second upper cladding layer 13, a p-type GaAs contact layer 14, a p electrode 15, and an n electrode 16.

The p-type $In_{x8}Ga_{1-x8}P$ second etching stop layer 8 ($0 \leq x8 \leq 1$) and the n-type GaAs first current confinement layer 9 are formed on the p-type GaAs first etching stop layer 7 other than three stripe areas of the p-type GaAs first etching stop layer 7 extending in the direction of a resonator to be formed in the semiconductor laser device, where one of the three stripe areas corresponds to a current injection region 20 having a width $d_c$, and the other stripe areas each have a width $d_c/2$, and are arranged on both sides of the current injection region 20 and separated from the current injection region 20 by $d_{b1}$. The p-type $In_{x9}Ga_{1-x9}P$ third etching stop layer 10 ($0 \leq x9 \leq 1$) is formed over the exposed surface of the p-type GaAs first etching stop layer 7 and the p-type $In_{x8}Ga_{1-x8}P$ second etching stop layer 8 and the entire surfaces of the n-type GaAs first current confinement layer 9. The p-type GaAs fourth etching stop layer 11 and the n-type $In_{0.49}Ga_{0.51}P$ second current confinement layer 12 are formed on the p-type $In_{x9}Ga_{1-x9}P$ third etching stop layer 10 other than a stripe area of the p-type $In_{x9}Ga_{1-x9}P$ third etching stop layer 10 corresponding to the current injection region 20. Thus, a stripe groove realizing the current injection region 20 is formed. The p-type $In_{0.49}Ga_{0.51}P$ second upper cladding layer 13, the p-type GaAs contact layer 14, and the p electrode 15 are formed over the n-type $In_{0.49}Ga_{0.51}P$ second current confinement layer 12 and the exposed surface of the p-type $In_{x9}Ga_{1-x9}P$ third etching stop layer 10 so as to fill the stripe groove.

Figure 2:
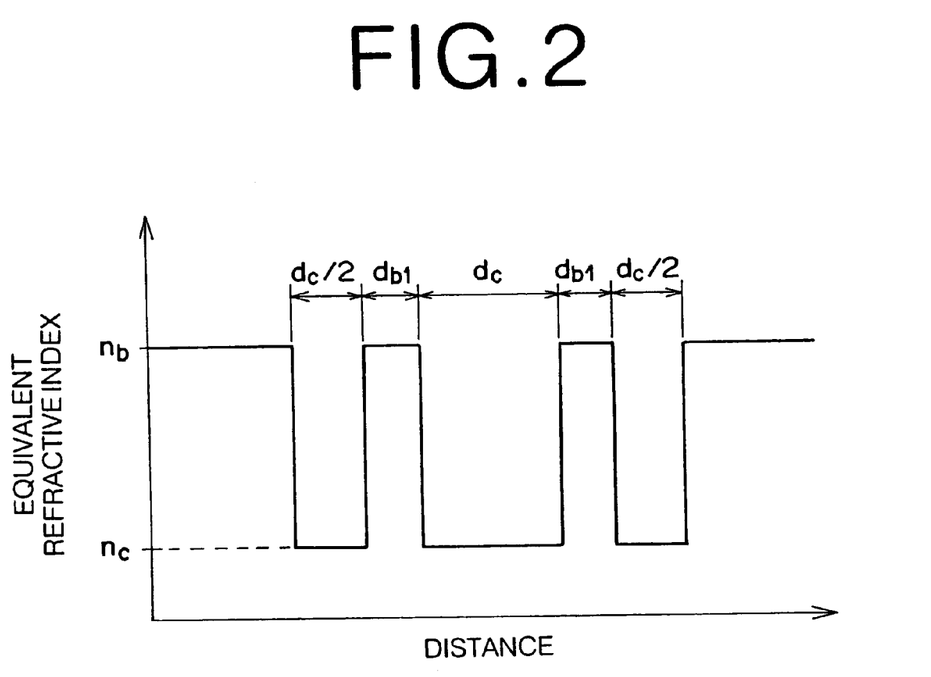
FIG. 2 is a diagram illustrating a distribution of the equivalent refractive index of the active layer in the direction perpendicular to thickness and propagation of light.

FIG. 2 shows a distribution of the equivalent refractive index of the active layer of the semiconductor laser device of FIG. 1 in the direction perpendicular to thickness and propagation of light. As illustrated in FIG. 2, the core region located at the center has a low equivalent refractive index $n_c$, a first pair of stripe regions being immediately adjacent to the core region on both sides and each having a width $d_{b1}$ have a high equivalent refractive index $n_b$, a second pair of stripe regions being located on the outer sides of the first pair of stripe regions and each having a width $d_c/2$ have the low equivalent refractive index $n_c$, and the other regions being located on the outer sides of the second pair of stripe regions have the high equivalent refractive index $n_b$. That is, a satisfactory ARROW structure is realized by the provision of the first and second pairs of regions. Therefore, it is possible to prevent leakage of light in the direction perpendicular to thickness and propagation of light (in which the above distribution of the equivalent refractive index is realized), and obtain a single-peak, diffraction-limited beam.

It is preferable that the width $d_{b1}$ is determined by the following equation (3), where $\lambda$ is the oscillation wavelength.

$$d_{b1} = \frac{3\lambda}{4\left\{n_b^2 - n_c^2 + \left(\frac{\lambda}{2d_c}\right)^2\right\}^{\frac{1}{2}}} \quad (3)$$

Second Embodiment

Figure 3:
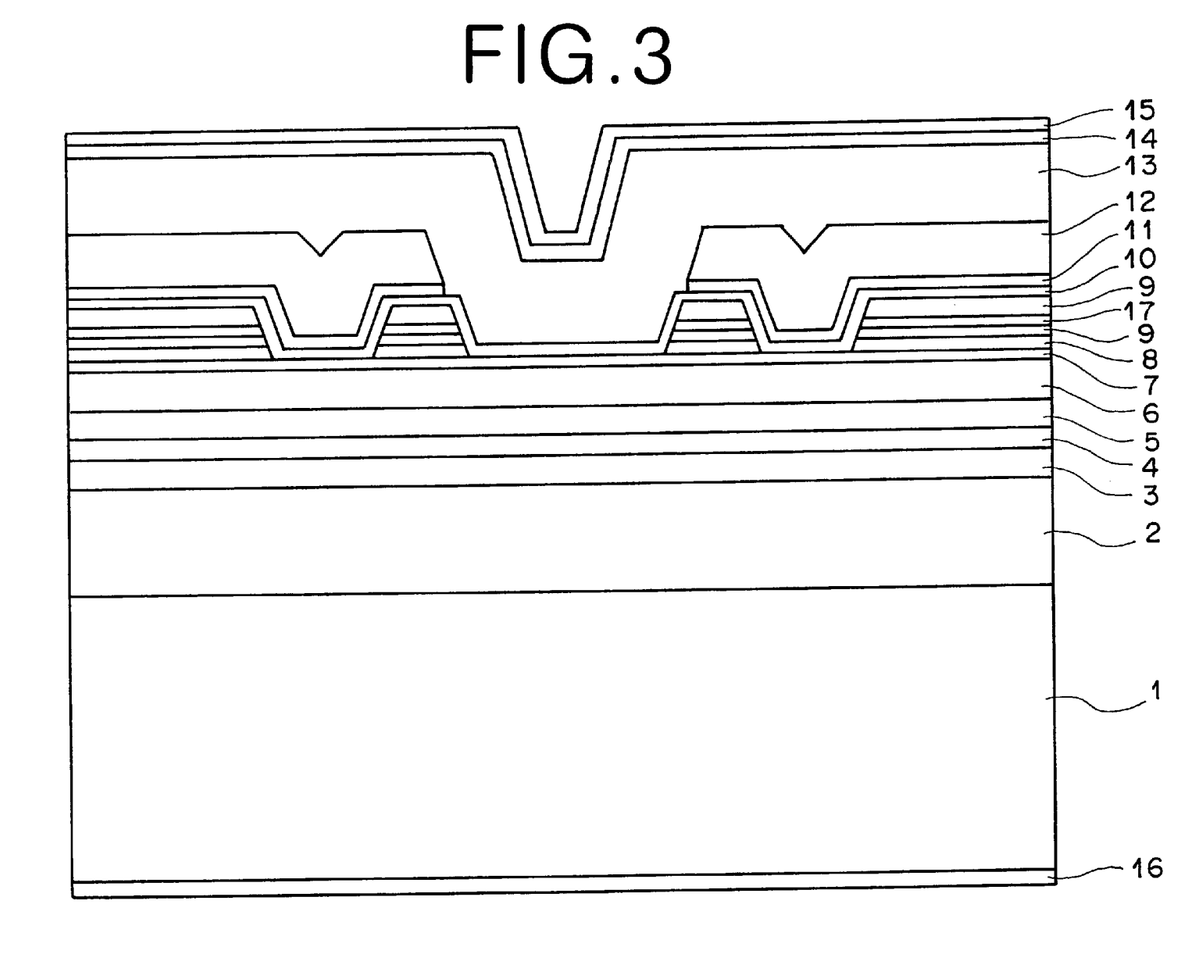
FIG. 3 is a diagram illustrating a cross section of a semiconductor laser device as a second embodiment of the present invention.

FIG. 3 shows a cross section of a semiconductor laser device as the second embodiment of the present invention. The elements in FIG. 3 which bear the same reference numerals as FIG. 1 have the same functions as the corresponding elements in FIG. 1. Therefore, the explanations on those elements are not repeated here.

In the construction of FIG. 3, the n-type GaAs first current confinement layer 9 is split into two layers, and a quantum-well layer 17 is formed between the two layers. The quantum-well layer 17 is formed with an InGaAs material which has a smaller bandgap than that of the $In_{x3}Ga_{1-x3}As_{1-y3}P_{y3}$ compressive-strain quantum-well active layer 4. Since the InGaAs quantum-well layer 17 absorbs light, the gain in the fundamental transverse mode is increased.

In addition, in order to compensate for the compressive strain in the active layer, it is possible to sandwich the $In_{x3}Ga_{1-x3}As_{1-y3}P_{y3}$ compressive-strain quantum-well active layer 4 with a pair of tensile-strain barrier layers made of i-type (intrinsic) $In_{x4}Ga_{1-x4}As_{1-y4}P_{y4}$ ($0 \leq x4 < 0.49y4$, $0 < y4 \leq 0.4$).

Further, the output power of the semiconductor laser device can be increased by suppressing non-radiative recombination currents produced by light absorption in the vicinities of the end facets. In order to suppress the non-radiative recombination currents, near-edge portions of the p-type GaAs contact layer 14 and the p electrode 15 may be removed.

Third Embodiment

Figure 4:
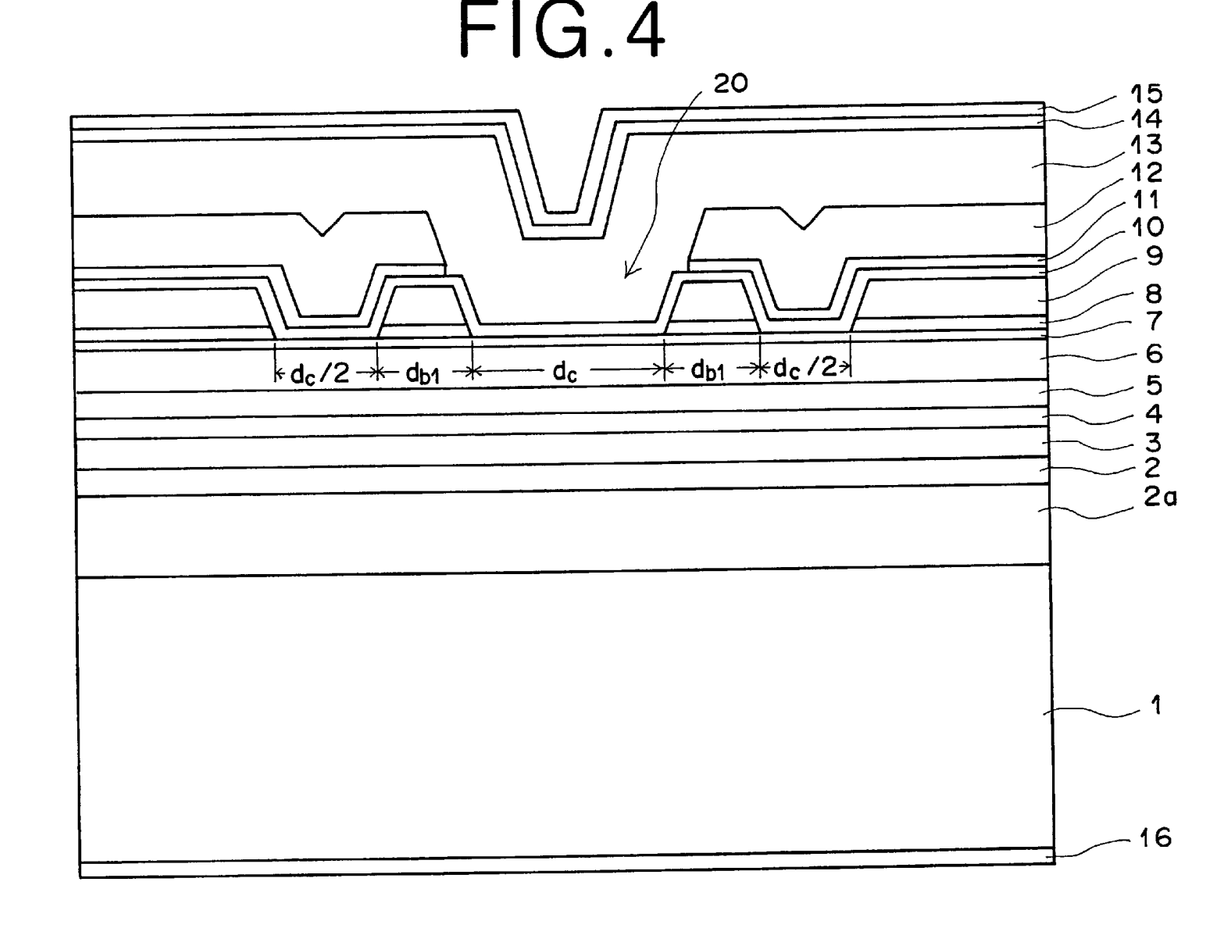
FIG. 4 is a diagram illustrating a cross section of a semiconductor laser device as a third embodiment of the present invention.

FIG. 4 shows a cross section of a semiconductor laser device as the third embodiment of the present invention. The elements in FIG. 4 which bear the same reference numerals as FIG. 1 have the same functions as the corresponding elements in FIG. 1. Therefore, the explanations on those elements are not repeated here.

In the construction of FIG. 4, another lower cladding layer 2a made of n-type $Al_xGa_{1-x}As$ ($0.45 \leq x \leq 0.55$) is formed between the n-type GaAs substrate 1 and the n-type $In_{0.49}Ga_{0.51}P$ lower cladding layer 2. That is, the lower cladding layer has a double-layer structure. In this case, it is preferable that the thickness of the n-type $In_{0.49}Ga_{0.51}P$ lower cladding layer 2 does not exceed 0.5 micrometers.

Fourth Embodiment

Although the semiconductor laser devices as the first to third embodiments of the present invention has a single-core ARROW structure, it is possible to form a multicore ARROW structure, in which a plurality of core regions are included.

Figure 5:
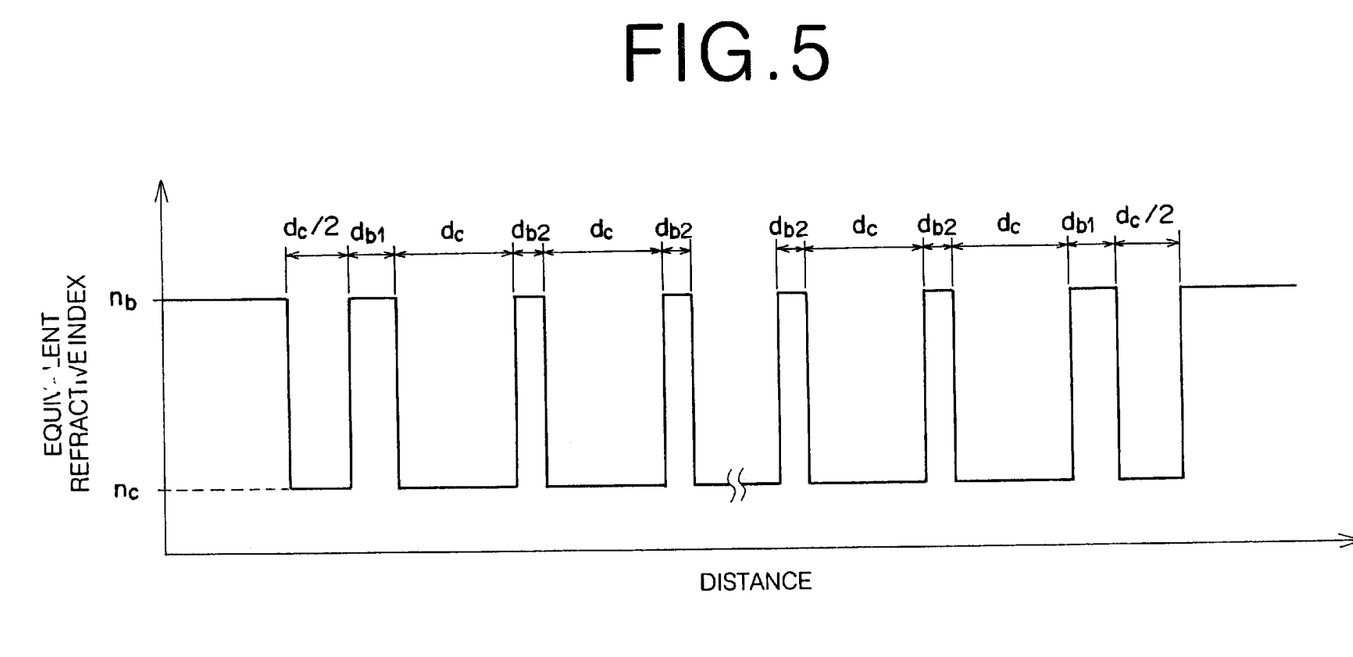
FIG. 5 is a diagram illustrating a distribution of the equivalent refractive index of an active layer in the direction perpendicular to thickness and propagation of light in a semiconductor laser device having a multicore ARROW structure.

FIG. 5 shows a distribution of the equivalent refractive index of an active layer in the direction perpendicular to thickness and propagation of light in a semiconductor laser device having a multicore ARROW structure. As illustrated in FIG. 5, the plurality of core regions have a low equivalent refractive index $n_c$, outermost ones of a plurality of high-refractive-index stripe regions having a high equivalent refractive index $n_b$ each have a width $d_{b1}$, and the other high-refractive-index stripe regions having the high equivalent refractive index $n_b$ each have a width $d_{b2}$. It is preferable that the width $d_{b1}$ is determined by the aforementioned equation (3), and the width $d_{b2}$ is determined by the following equation (4).

$$d_{b2} = \frac{\lambda}{2\left\{n_b^2 - n_c^2 + \left(\frac{\lambda}{2d_c}\right)^2\right\}^{\frac{1}{2}}} \quad (4)$$

Figure 6:
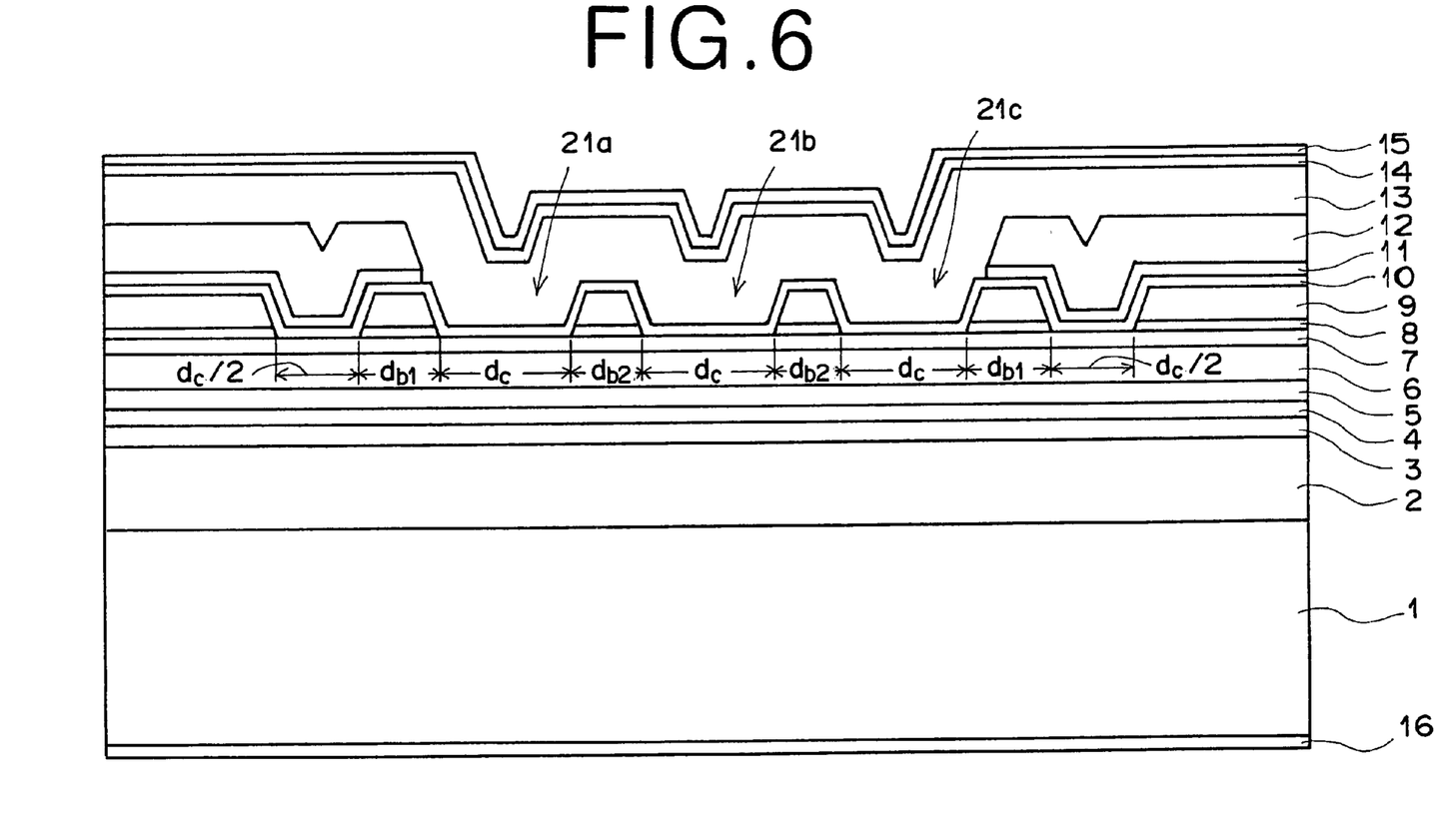
FIG. 6 is a diagram illustrating a cross section of a semiconductor laser device as a fourth embodiment of the present invention.

FIG. 6 shows a cross section of a semiconductor laser device as the fourth embodiment of the present invention. The elements in FIG. 6 which bear the same reference numerals as FIG. 1 have substantially the same functions as the corresponding elements in FIG. 1. Therefore, the explanations on those elements are not repeated here.

In the construction of FIG. 6, three core regions are formed, i.e., a multicore ARROW structure is realized, by using substantially the same semiconductor layers as the construction of FIG. 1. That is, three current injection regions $21a$, $21b$, and $21c$ are realized between four stripe regions formed with the p-type $In_{x8}Ga_{1-x8}P$ second etching stop layer 8 and the n-type GaAs first current confinement layer 9. Two outermost ones of the four stripe regions each have the width $d_{b1}$, and the other stripe regions which separate the three current injection regions $21a$, $21b$, and $21c$ each have the width $d_{b2}$. The p-type $In_{x8}Ga_{1-x8}P$ second etching stop layer 8 and the n-type GaAs first current confinement layer 9 have three stripe openings corresponding to the three current injection regions $21a$, $21b$, and $21c$ and each having the width $d_c$ and a pair of stripe openings being located on the outer sides of the two outermost ones of the four stripe regions and each having the width $d_c/2$.

Since the multicore ARROW structure includes a plurality of core regions, the output power of the semiconductor laser device can be increased.

Production Process I

An example of a process (production process I) for producing the semiconductor laser device as the first embodiment is explained below. FIGS. 7A to 7D show cross sections of layered constructions in the representative stages of the example of the process.

In the process explained below, trimethyl gallium (TMG), trimethyl indium (TMI), trimethyl aluminum (TMA), arsine, and phosphine are used as raw materials, silane gas is used as n-type dopant gas, and dimethyl zinc (DMZ) is used as p-type dopant gas.

Figure 7A:
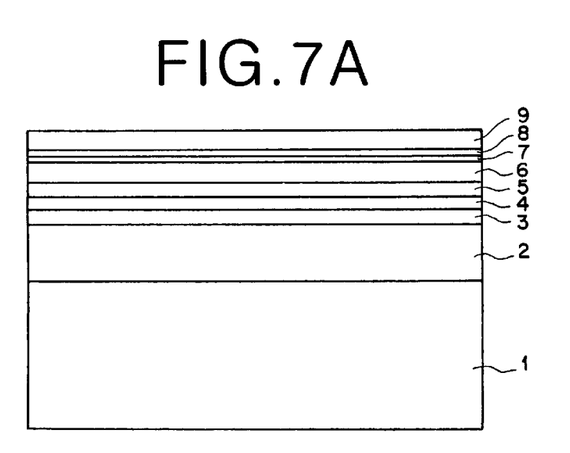
FIGS. 7A to 7D are diagrams illustrating representative stages of an example of a process for producing the semiconductor laser device as the first embodiment.

First, as illustrated in FIG. 7A, an n-type $In_{0.49}Ga_{0.51}P$ lower cladding layer 2, an n-type or i-type (intrinsic) $In_{x1}Ga_{1-x1}As_{1-y1}P_{y1}$ lower optical waveguide layer 3 (x1= 0.49y1, $0 \leq y1 \leq 0.3$) having a thickness of 0.1 micrometers, an $In_{x3}Ga_{1-x3}As_{1-y3}P_{y3}$ compressive-strain quantum-well active layer 4 ($0.49y3 < x3 \leq 0.4$, $0 \leq y3 \leq 0.1$) having a thickness of about 5 to 20 nm, a p-type or i-type $In_{0.49}Ga_{1-x1}As_{1-y1}P_{y1}$ upper optical waveguide layer 5 having a thickness of 0.1 micrometers, a p-type $In_{0.49}Ga_{0.51}P$ first upper cladding layer 6 having a thickness of 0.15 micrometers, and a p-type GaAs first etching stop layer 7, a p-type $In_{x8}Ga_{1-x8}P$ second etching stop layer 8 ($0 \leq x8 \leq 1$), and an n-type GaAs first current confinement layer 9 having a thickness of 0.5 micrometers are formed on an n-type GaAs (001) substrate 51 by organometallic vapor phase epitaxy.

The oscillation wavelength can be controlled within the range between 900 and 1,200 nm by varying the composition of the active layer. For example, when x3=0.2 and y3=0, the oscillation wavelength becomes 980 nm.

Figure 7B:
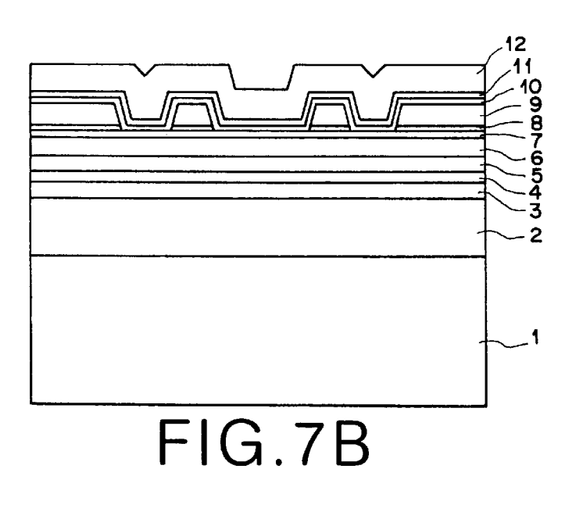

Next, a resist pattern which includes a center stripe opening and two side stripe openings is formed on the n-type GaAs first current confinement layer 9 by photolithography. The center stripe opening corresponds to the current injection region 20, and has a width of 6 micrometers. The side stripe openings each have a width of 3 micrometers, and are located on both sides of the center stripe opening and separated from the center stripe opening by 1.8 micrometers. The n-type GaAs first current confinement layer 9 is etched with a solution of sulfuric acid and hydrogen peroxide as an etchant by using the resist pattern as a mask. At this time, the etching automatically stops at the upper surface of the p-type $In_{x8}Ga_{1-x8}P$ second etching stop layer 8, and stripe areas of the p-type $In_{x8}Ga_{1-x8}P$ second etching stop layer 8 corresponding to the above center and side stripe openings are exposed. Then, the resist is removed, and the exposed stripe areas of the p-type $In_{x8}Ga_{1-x8}P$ second etching stop layer 8 are etched with a hydrochloric acid etchant. At this time, the etching automatically stops at the upper surface of the p-type GaAs first etching stop layer 7, and stripe areas of the p-type GaAs first etching stop layer 7 corresponding to the above center and side stripe openings are exposed. Subsequently, the temperature is raised in an arsenic atmosphere, and thereafter the gas is changed in turn so that a p-type $In_{x9}Ga_{1-x9}P$ third etching stop layer 10 ($0 \leq x9 \leq 1$), a p-type GaAs fourth etching stop layer 11, and an n-type $In_{0.49}Ga_{0.51}P$ second current confinement layer 12 having a thickness of 0.5 micrometers are formed on the entire surface of the construction layered and etched as above, as illustrated in FIG. 7B.

Figure 7C:
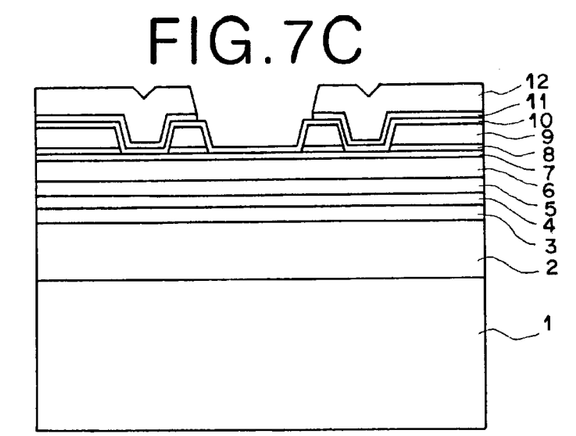

Subsequently, a resist is applied to the surface of the n-type $In_{0.49}Ga_{0.51}P$ second current confinement layer 12, and an area of the resist corresponding to the current injection region 20 is removed so as to expose a stripe area of the n-type $In_{0.49}Ga_{0.51}P$ second current confinement layer 12 corresponding to the current injection region 20 is exposed. Then, the exposed stripe area of the n-type $In_{0.49}Ga_{0.51}P$ second current confinement layer 12 is etched with a hydrochloric acid etchant by using the remaining resist as a mask. At this time, the etching automatically stops at the upper surface of the p-type GaAs fourth etching stop layer 11, and a stripe area of the p-type GaAs fourth etching stop layer 11 corresponding to the current injection region 20 is exposed. Thereafter, the remaining resist is removed, and the exposed stripe area of the p-type GaAs fourth etching stop layer 11 is etched with a sulfuric acid etchant. At this time, the etching automatically stops at the upper surface of the p-type $In_{x9}Ga_{1-x9}P$ third etching stop layer 10, and a stripe area of the p-type $In_{x9}Ga_{1-x9}P$ third etching stop layer 10 corresponding to the current injection region 20 is exposed. Thus, a groove for the current injection region 20 is formed as illustrated in FIG. 7C. That is, only the InGaP layers are exposed at the base surface of regrowth.

Figure 7D:
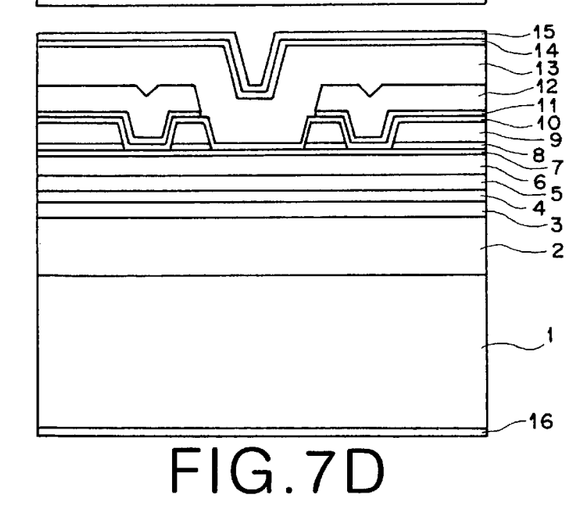

Finally, the temperature is raised in a phosphorus atmosphere, and thereafter a p-type $In_{0.49}Ga_{0.51}P$ second upper cladding layer 13 and a p-type GaAs contact layer 14 are formed as illustrated in FIG. 7D. Then, a p electrode 15 is formed on the p-type GaAs contact layer 14. In addition, the exposed (opposite) surface of the substrate 1 is polished, and an n electrode 16 is formed on the polished surface of the substrate 1. Next, both end surfaces of the layered construction are cleaved so as to form resonator surfaces, and a high reflectance coating and a low reflectance coating are provided on the respective resonator surfaces. Thereafter, the above construction is formed into a chip of a semiconductor laser device.

Production Process II

An example of a process (production process II) for producing the semiconductor laser device as the third embodiment is explained below. FIGS. 8A to 8D show cross sections of layered constructions in the representative stages of the example of the process.

In the process explained below, the same raw materials and gas as the production process I are used.

Figure 8A:
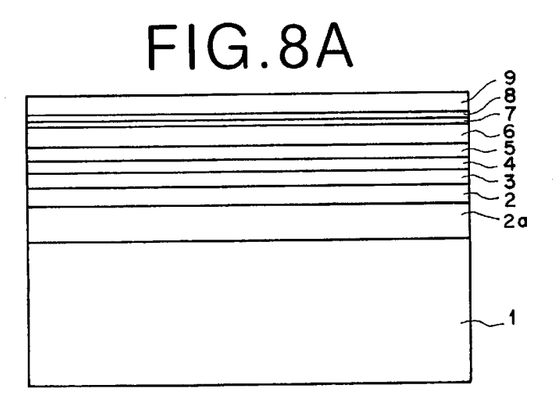
FIGS. 8A to 8D are diagrams illustrating representative stages of an example of a process for producing the semiconductor laser device as the third embodiment.

First, as illustrated in FIG. 8A, an n-type $Al_xGa_{1-x}As$ first lower cladding layer 2a ($0.45 \leq x \leq 0.55$), an n-type $In_{0.49}Ga_{0.51}P$ second lower cladding layer 2, an n-type or i-type (intrinsic) $In_{x1}Ga_{1-x1}As_{1-y1}P_{y1}$ lower optical waveguide layer 3 ($x1=0.49y1$, $0 \leq y1 \leq 0.3$), an $In_{x3}Ga_{1-x3}As_{1-y3}P_{y3}$ compressive-strain quantum-well active layer 4 ($0.49y3 < x3 \leq 0.4$, $0 \leq y3 \leq 0.1$), a p-type or i-type $In_{x1}Ga_{1-x1}As_{1-y1}P_{y1}$ upper optical waveguide layer 5, a p-type $In_{0.49}Ga_{0.51}P$ first upper cladding layer 6, and a p-type GaAs first etching stop layer 7, a p-type $In_{x8}Ga_{1-x8}P$ second etching stop layer 8 ($0 \leq x8 \leq 1$), and an n-type GaAs first current confinement layer 9 having a thickness of 0.5 micrometers are formed on an n-type GaAs (001) substrate 1 by organometallic vapor phase epitaxy. The thickness of the n-type $In_{0.49}Ga_{0.51}P$ lower cladding layer 2 is equal to or smaller than 0.5 micrometers. In addition, the first upper cladding layer 6 may be made of p-type $Al_xGa_{1-x}As$ which has an approximately identical refractive index to that of p-type $In_{0.49}Ga_{0.51}P$.

Figure 8B:
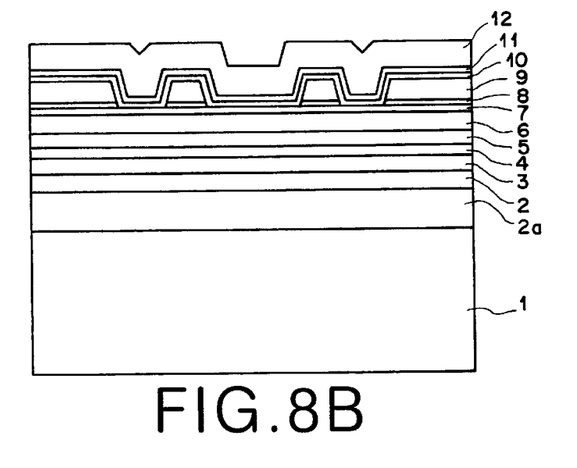

Next, a resist pattern which includes a center stripe opening and two side stripe openings is formed on the n-type GaAs first current confinement layer 9 by photolithography. The center stripe opening corresponds to the current injection region 20, and has a width of 5 micrometers. The side stripe openings each have a width of 2.5 micrometers, and are located on both sides of the center stripe opening and separated from the center stripe opening by 1.9 micrometers. The n-type GaAs first current confinement layer 9 is etched with a solution of sulfuric acid and hydrogen peroxide as an etchant by using the resist pattern as a mask. At this time, the etching automatically stops at the upper surface of the p-type $In_{x8}Ga_{1-x8}P$ second etching stop layer 8, and stripe areas of the p-type $In_{x8}Ga_{1-x8}P$ second etching stop layer 8 corresponding to the above center and side stripe openings are exposed. Then, the resist is removed, and the exposed stripe areas of the p-type $In_{x8}Ga_{1-x8}P$ second etching stop layer 8 are etched with a hydrochloric acid etchant. At this time, the etching automatically stops at the upper surface of the p-type GaAs first etching stop layer 7, and stripe areas of the p-type GaAs first etching stop layer 7 corresponding to the above center and side stripe openings are exposed. Subsequently, the temperature is raised in an arsenic atmosphere, and thereafter the gas is changed in turn so that a p-type $In_{x9}Ga_{1-x9}P$ third etching stop layer 10 ($0 \leq x9 \leq 1$), a p-type GaAs fourth etching stop layer 11, and an n-type $In_{0.49}Ga_{0.51}P$ second current confinement layer 12 are formed on the entire surface of the construction layered and etched as above, as illustrated in FIG. 8B.

Figure 8C:
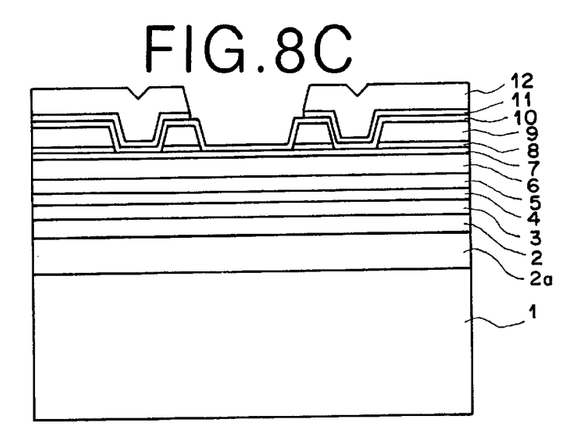
Figure 8D:
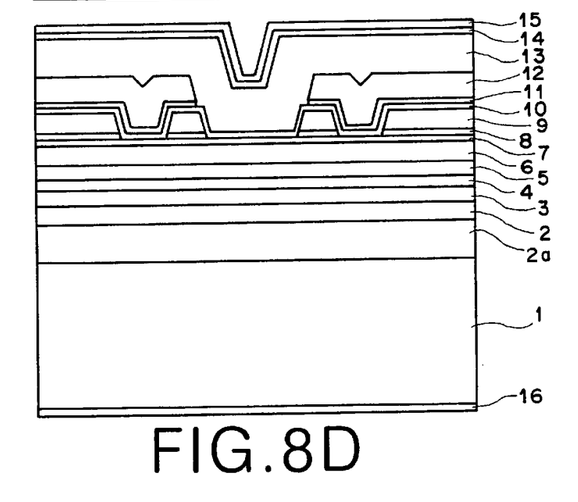

Subsequently, a groove for the current injection region 20 is formed as illustrated in FIG. 8C, and a p-type $In_{0.49}Ga_{0.51}P$ second upper cladding layer 13, a p-type GaAs contact layer 14, a p electrode 15, and an n electrode 16 are formed as illustrated in FIG. 8D, in the same manner as the production method I. Finally, both end surfaces of the layered construction are cleaved so as to form resonator surfaces, and a high reflectance coating and a low reflectance coating are provided on the respective resonator surfaces. Then, the above construction is formed into a chip of a semiconductor laser device.

Additional Matters (i) The first and second upper cladding layers 6 and 13 in the constructions of the first to fourth embodiments may be made of p-type $Al_xGa_{1-x}As$ which has an approximately identical refractive index to that of $In_{0.49}Ga_{0.51}P$.

(ii) Each layer in the constructions of the first to fourth embodiments may be formed by molecular beam epitaxy using solid or gas raw material.

(iii) Although the constructions of the first to fourth embodiments are formed on the n-type GaAs substrates, instead, p-type GaAs substrates may be used. When the GaAs substrates are p-type, the conductivity types of all of the other layers in the constructions of the first to fourth embodiments should be inverted.

(iv) Since the semiconductor laser devices according to the present invention can emit a high-quality Gaussian light beam even in a high power operation, the semiconductor laser devices according to the present invention can be used as a light source in the fields of high-speed, information processing, image processing, communications, laser measurement, medicine, printing, and the like.

What is claimed is:

1. A semiconductor laser device comprising:

a GaAs substrate of a first conductive type;

a first lower cladding layer formed above said GaAs substrate and made of $In_{0.49}Ga_{0.51}P$ of said first conductive type;

a lower optical waveguide layer formed above said first lower cladding layer and made of $In_{x1}Ga_{1-x1}As_{1-y1}P_{y1}$ which is undoped or said first conductive type, where $x1=0.49y1$ and $0 \leq y1 \leq 0.3$;

a compressive-strain quantum-well active layer formed above said lower optical waveguide layer and made of $In_{x3}Ga_{1-x3}As_{1-y3}P_{y3}$, where $0.49y3 < x3 \leq 0.4$ and $0 \leq y3 \leq 0.1$;

an upper optical waveguide layer formed above said compressive-strain quantum-well active layer and made of $In_{x1}Ga_{1-x1}As_{1-y1}P_{y1}$ which is undoped or a second conductive type, where $x1=0.49y1$ and $0 \leq y1 \leq 0.3$;

a first upper cladding layer of said second conductive type, formed above said upper optical waveguide layer and made of one of $In_{0.49}Ga_{0.51}P$ and $Al_xGa_{1-x}As$ which has an approximately identical refractive index to a refractive index of $In_{0.49}Ga_{0.51}P$, where $0.45 \leq x \leq 0.55$;

a first etching stop layer formed above said first upper cladding layer and made of GaAs of said second conductive type;

a second etching stop layer made of $In_{x8}Ga_{1-x8}P$ of said second conductive type and formed above said first etching stop layer other than stripe areas of the first etching stop layer corresponding to at least one current injection region and low-refractive-index regions located on outer sides of the at least one current injection region and separated from the at least one current injection region or outermost ones of the at least one current injection region by a predetermined interval, where $0 \leq x8 \leq 1$, and said stripe areas of the first etching stop layer extend in a direction of a laser resonator;

a first current confinement layer made of GaAs of said first conductive type and formed above said second etching stop layer;

a third etching stop layer made of $In_{x9}Ga_{1-x9}P$ of said second conductive type and formed over said first current confinement layer and said stripe areas of said first etching stop layer, where $0 \leq x9 \leq 1$;

a fourth etching stop layer made of GaAs of said second conductive type and formed above said third etching stop layer other than at least one stripe area of the third etching stop layer corresponding to said at least one current injection region;

a second current confinement layer made of $In_{0.49}Ga_{0.51}P$ of said first conductive type and formed above said fourth etching stop layer;

a second upper cladding layer of said second conductive type, formed above said second current confinement layer and said at least one stripe area of the third etching stop layer, and made of one of $In_{0.49}Ga_{0.51}P$ and $Al_xGa_{1-x}As$ which has an approximately identical refractive index to the refractive index of $In_{0.49}Ga_{0.51}P$, where $0.45 \leq x \leq 0.55$; and a contact layer made of GaAs of said second conductive type and formed above said second upper cladding layer.

2. A semiconductor laser device according to claim 1, wherein said current injection region has a width equal to or greater than 3 micrometers.

3. A semiconductor laser device according to claim 1, wherein said first current confinement layer includes, first and second sublayers made of GaAs of said first conductive type, and a quantum-well layer formed between said first and second sublayers and made of an InGaAs material which has a smaller bandgap than a bandgap of the compressive-strain quantum-well active layer.

4. A semiconductor laser device according to claim 1, further comprising a second lower cladding layer made of $Al_xGa_{1-x}As$ of said first conductive type and formed between said GaAs substrate and said first lower cladding layer, where $0.45 \leq x \leq 0.55$.

5. A process for producing a semiconductor laser device, comprising the steps of:

(a) forming above a GaAs substrate of a first conductive type a lower cladding layer made of $In_{0.49}Ga_{0.51}P$ of the first conductive type;

(b) forming above said lower cladding layer a lower optical waveguide layer made of $In_{x1}Ga_{1-x1}As_{1-y1}P_{y1}$ which is undoped or said first conductive type, where $x1=0.49y1$ and $0 \leq y1 \leq 0.3$;

(c) forming above said lower optical waveguide layer a compressive-strain quantum-well active layer made of $In_{x3}Ga_{1-x3}As_{1-y3}P_{y3}$, where $0.49y3<x3 \leq 0.4$ and $0 \leq y3 \leq 0.1$;

(d) forming above said compressive-strain quantum-well active layer an upper optical waveguide layer made of $In_{x1}Ga_{1-x1}As_{1-y1}P_{y1}$ which is undoped or a second conductive type, where $x1=0.49y1$ and $0 \leq y1 \leq 0.3$;

(e) forming above said upper optical waveguide layer a first upper cladding layer of said second conductive type which is made of one of $In_{0.49}Ga_{0.51}P$ and $Al_xGa_{1-x}As$ having an approximately identical refractive index to a refractive index of $In_{0.49}Ga_{0.51}P$, where $0.45 \leq x \leq 0.55$;

(f) forming above said first upper cladding layer a first etching stop layer made of GaAs of said second conductive type;

(g) forming above said first etching stop layer a second etching stop layer made of $In_{x8}Ga_{1-x8}P$ of said second conductive type, where $0 \leq x8 \leq 1$;

(h) forming above said second etching stop layer a first current confinement layer made of GaAs of said first conductive type;

(i) removing stripe regions of said first current confinement layer and said first etching stop layer so as to produce an intermediate layered structure in which stripe areas of said first etching stop layer are exposed, where said stripe areas of the first etching stop layer extend in a direction of a laser resonator, and correspond to at least one current injection region and low-refractive-index regions located on outer sides of the at least one current injection region and separated from the at least one current injection region or outermost ones of the at least one current injection region by a predetermined interval;

(j) raising the temperature of said intermediate layered structure in an arsenic atmosphere;

(k) forming above said first current confinement layer and said stripe areas of the first etching stop layer a third etching stop layer made of $In_{x9}Ga_{1-x9}P$ of said second conductive type, where $0 \leq x9 \leq 1$;

(l) forming above said third etching stop layer a fourth etching stop layer made of GaAs of said second conductive type;

(m) forming above said fourth etching stop layer a second current confinement layer made of $In_{0.49}Ga_{0.51}P$ of said first conductive type;

(n) removing stripe regions of said second current confinement layer and said fourth etching stop layer so that at least one stripe area of said third etching stop layer is exposed, where said at least one stripe area of the third etching stop layer corresponds to said at least one current injection region;

(o) forming above said second current confinement layer and said at least one stripe area of said third etching stop layer a second upper cladding layer of said second conductive type which is made of one of $In_{0.49}Ga_{0.51}P$ and $Al_xGa_{1-x}As$ having an approximately identical refractive index to the refractive index of $In_{0.49}Ga_{0.51}P$, where $0.45 \leq x \leq 0.55$; and (p) forming above said second upper cladding layer a contact layer made of GaAs of said second conductive type.

* * * * *